United States Patent
Grötsch

(10) Patent No.: US 7,115,962 B2
(45) Date of Patent: Oct. 3, 2006

(54) HOUSING FOR A PHOTOACTIVE SEMICONDUCTOR CHIP AND A METHOD FOR THE PRODUCTION THEREOF

(75) Inventor: Stefan Grötsch, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 140 days.

(21) Appl. No.: 10/479,008

(22) PCT Filed: May 23, 2002

(86) PCT No.: PCT/DE02/01897

§ 371 (c)(1),
(2), (4) Date: May 7, 2004

(87) PCT Pub. No.: WO02/095821

PCT Pub. Date: Nov. 28, 2002

(65) Prior Publication Data

US 2004/0178418 A1    Sep. 16, 2004

(30) Foreign Application Priority Data

May 23, 2001  (DE) ............................... 101 25 374

(51) Int. Cl.
H01L 31/0203 (2006.01)
H01L 31/0232 (2006.01)
H01L 25/16 (2006.01)
H01L 21/00 (2006.01)

(52) U.S. Cl. .................... 257/434; 257/431; 257/432; 257/433; 257/E25.032; 438/48; 438/64

(58) Field of Classification Search .................. None
See application file for complete search history.

(56) References Cited

U.S. PATENT DOCUMENTS 5,132,532 A * 7/1992 Watanabe ................... 250/239
5,841,178 A * 11/1998 Butrie et al. ................ 257/433
6,420,205 B1 * 7/2002 Sawai ........................ 438/65
6,531,341 B1 * 3/2003 Peterson et al. ............ 438/123

FOREIGN PATENT DOCUMENTS

| JP | 61-13677 | | 1/1986 |
|----|----------|---|--------|
| JP | 361013677 A | * | 1/1986 |
| JP | 06151629 | | 5/1995 |
| JP | 08316503 | | 11/1996 |
| JP | 10275873 | | 10/1998 |
| JP | 410275873 A | * | 10/1998 |
| JP | 11176017 | | 7/1999 |
| JP | 2000223605 | | 8/2000 |
| WO | WO 8702833 | | 5/1987 |

* cited by examiner

Primary Examiner—Luan Thai
(74) Attorney, Agent, or Firm—Cohen, Pontani, Lieberman & Pavane

(57) ABSTRACT

In a process for producing a ceramic housing (1), first of all a ceramic base body (4) comprising a ceramic base (2) and side parts (3) is produced. Then, a metal frame (7) is placed onto the ceramic base body (4) and a window (11) is soldered onto a side opening (6). After a photoactive semiconductor chip has been introduced into the ceramic base body (4), the ceramic housing (1) is closed off using a metal cover (12).

15 Claims, 3 Drawing Sheets

Figure 1:
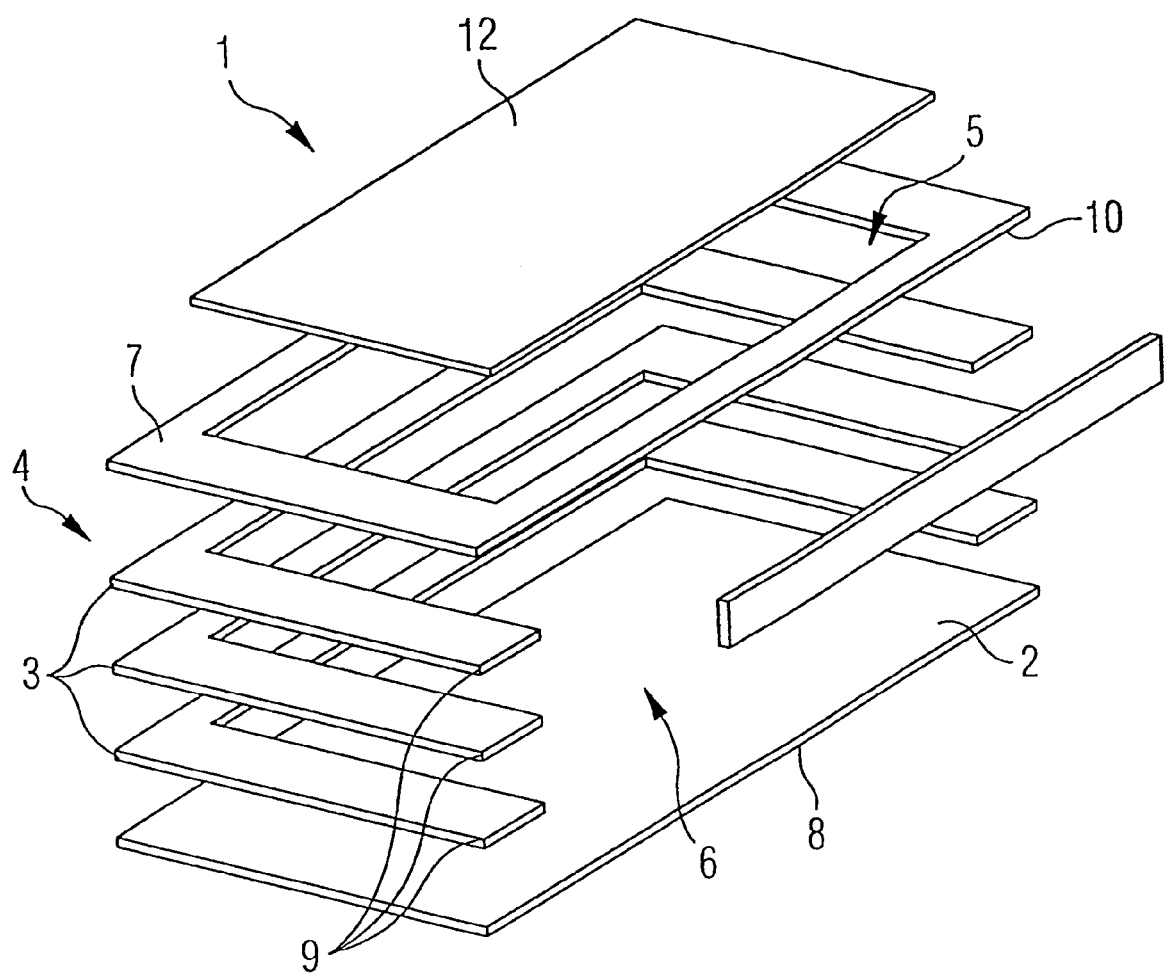

HOUSING FOR A PHOTOACTIVE SEMICONDUCTOR CHIP AND A METHOD FOR THE PRODUCTION THEREOF

This is a U.S. national stage of application no. PCT/DE02/01897 filed on 23 May 2002. Immediately after the insertion of the new first sentence, insert the following paragraph:

This patent application claims the priority of German patent application No. 10125374.5, the disclosure content of which is hereby incorporated by reference.

The invention relates to a process for producing a housing for a photoactive semiconductor chip.

The invention also relates to a housing for a photoactive semiconductor chip having a trough-shaped ceramic base body.

Ceramic housings of this type are generally known. They have the advantage over plastic housings that they are able to withstand both low and high temperatures. Whereas plastic housings become brittle at low temperatures and soften at high temperatures, with ceramic housings scarcely any changes occur to the materials properties.

A wide range of forms of ceramic housings for semiconductor chips are available. In the case of what are known as LCC ("leadless chip carrier") ceramic housings, for example, no contact pins which lead to the outside are fitted to the housing. Rather, this type of housing is designed for SMD technology.

Hitherto, however, ceramic housings for photoactive semiconductor chips whose side walls are transparent to light over a large area have not been disclosed. However, ceramic housings of this type are needed if a plurality of optically active semiconductor chips, such as for example semiconductor lasers, are to be arranged in a ceramic housing, since in this case the light from each optically active component has to be able to emerge through the side wall of the ceramic housing.

Proceeding from this prior art, the invention is based on the object of providing a process for producing ceramic housings having a window in a side wall.

The invention is also based on the object of providing a ceramic housing which is suitable for photoactive semiconductor chips.

According to the invention, these objects are achieved by a process having the following process steps:
  providing a trough-shaped ceramic base body having a trough opening, into one side wall of which a side opening is formed from the trough opening,
  forming a securing surface, which surrounds the side opening, for a window by fitting a metal part, which separates the trough opening from the side opening, to the ceramic base body; and
  fitting the window to the securing surface.

A housing according to the invention has a trough-shaped ceramic base body, into one side wall of which a side opening is formed, which side opening is separated from the trough opening by a metal part which, together with edges of the ceramic base body, forms a securing surface to which a window is fitted.

In the process according to the invention, first of all the ceramic base body is formed. This ceramic base body does not have any projecting ceramic parts of low material thickness. The ceramic base body therefore has a high strength and robustness.

The frame for the window is formed by the edges of the ceramic base body and by the metal part which is fitted to the ceramic base body after the latter has been produced. In this way, a frame-like securing surface is formed in a side wall without unsupported ceramic parts of low material thickness being present on the ceramic base body or a large overall size having to be selected for the housing. Moreover, the metal part can be secured to the ceramic base body with the aid of conventional soldering processes. It can therefore be produced without additional outlay using standard processes employed in the semiconductor industry.

According to a preferred configuration of the process, a metal frame which surrounds the trough opening is used for the metal part.

Photoactive semiconductor chips can be introduced into the ceramic housing through the metal frame and can be bonded there. Then, a metal cover can be placed onto the metal frame and soldered to the metal frame, so that a hermetically sealed housing for the photoactive semiconductor chips is produced.

Further advantageous configurations of the invention form the subject matter of the dependent claims.

Figure 2:
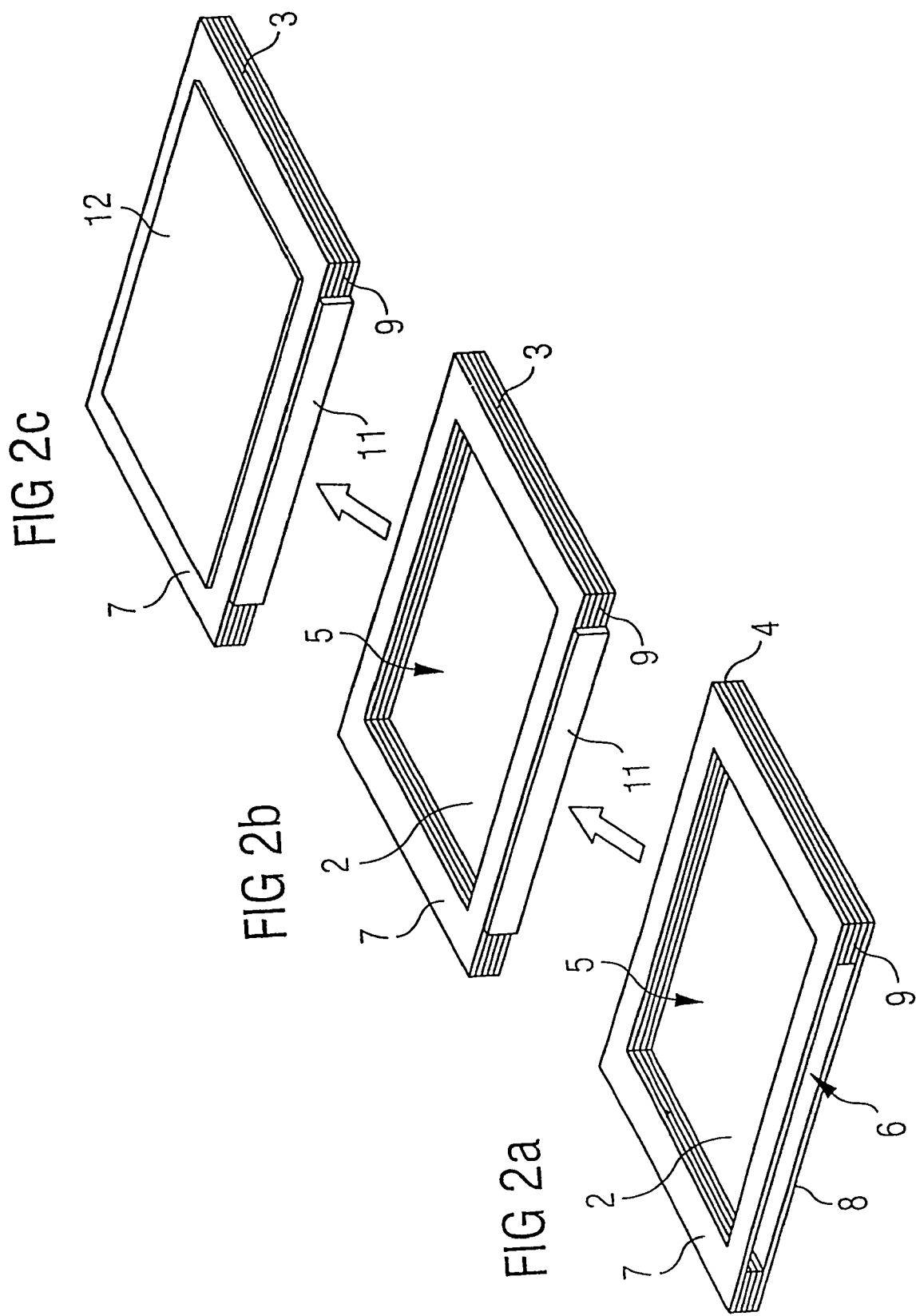
Figure 3:
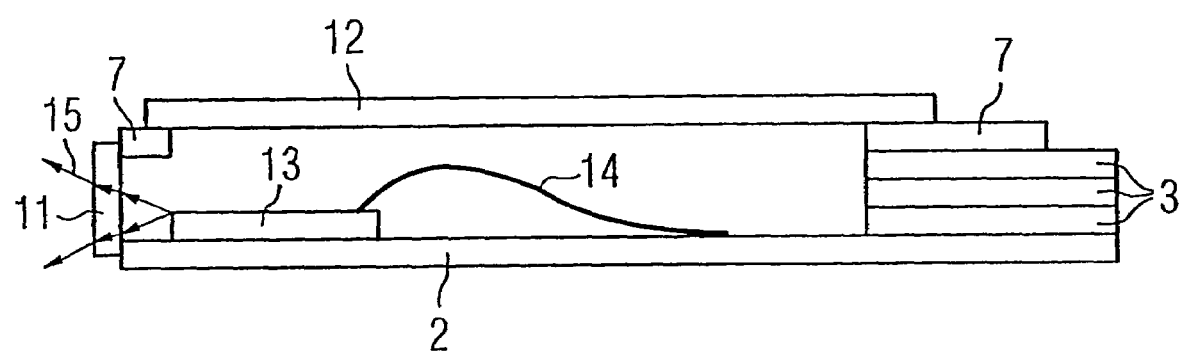

The invention is explained in more detail below with reference to the appended drawings, in which:

FIG. 1 shows an exploded view of a ceramic housing;

FIGS. 2a to c show successive process steps involved in the production of the ceramic housing; and FIG. 3 shows a cross section through a ceramic housing according to the invention.

The ceramic housing 1 shown in FIG. 1 has a ceramic base 2. The side walls of the ceramic housing 1 are formed by U-shaped side parts 3 stacked on top of one another. The ceramic base 2 and the side parts 3 together form a ceramic base body 4, which can be clearly seen in particular in FIGS. 2a to 2c. The ceramic base body 4 is produced by the side parts 3 being stacked onto the ceramic base 2 and the ceramic base 2 together with the side parts 3 then being sintered to form the ceramic base body 4. This process is known to the person skilled in the art and does not form the subject of the invention.

The ceramic base body 4 is-in trough-shaped form with a trough opening 5. On account of the U-shaped form of the side parts 3, the ceramic base body also has a side opening 6, which is separated from the trough opening 5 by a metal frame 7 which surrounds the trough opening 5 and is fitted to the ceramic base body 4. A window 11 is fitted to a securing surface formed by a front side 8 of the ceramic base 2, by front sides of the side parts 3 and a front side 10 of the metal frame 7. Finally, the ceramic housing 1 is closed off by a metal cover 12 fitted to the metal frame 7.

The process for producing the ceramic housing 1 will now be explained in detail with reference to FIGS. 2a to 2c.

First of all, the ceramic base body 4 is produced by the side parts 3 being applied to the ceramic base 2. Then, the ceramic base 2 and the side parts 3 are sintered together to form the ceramic base body 4. Then, the metal frame 7 is soldered onto the ceramic base body 4. In particular one of the standard brazing solders is suitable for this purpose. Brazing solders of this type are known to the person skilled in the art and do not form the subject of the invention.

Then, the side opening 6 is hermetically sealed by the window 11. This can be carried out either with the aid of soldering glass or with the aid of metal solders, in which case the window must be provided with a metal layer at the locations which bear against the securing surface, in order to ensure that the metal solder wets the window 11.

The window 11 is typically made from a glass whose coefficient of thermal expansion is matched to the coefficient of thermal expansion of the ceramic base body 4. Commercially available glass grades have expansion coefficients of between 0.5 and $20 \times 10^{-6}/°$ C. Therefore, it is eminently possible to match the coefficient of thermal expansion of the window 11 to the expansion coefficient of the ceramic base body 4, since in the case of a ceramic based on $Al_2O_3$ the coefficient of thermal expansion is, for example, between $6–6.5\times10^{-6}/°$ C.

The window 11 may also be coated with an antireflection coating or a filter layer. Furthermore, it is possible for lenses or guides or flanges for optical waveguides to be formed in the window 11.

After the window 11 has been soldered on, a photoactive semiconductor chip 3 can be introduced into the ceramic base body, where it can be bonded, for example with the aid of gold wires 14. Then, the metal cover 12 can be soldered onto the metal frame 17. This results in a hermetically sealed housing which has an improved dissipation of heat via the ceramic base body 4 compared to plastic housings. The photoactive semiconductor chip 13 introduced may be a semiconductor chip which emits and/or receives electromagnetic radiation.

It is also possible for conductor tracks which lead to contacts (not shown) on the underside of the ceramic base 2 to be formed on the ceramic base 2. In a modified embodiment, by way of example, two contact pins are introduced at the ceramic base, enabling the ceramic housing 1 to be soldered into a printed circuit board.

The semiconductor chip 13 may, for example, be a linear array of lasers. A wide linear array of lasers of this nature can also emit light 15 through the extended window 11.

Accordingly, the ceramic housing is suitable for applications in automotive engineering, for example for receiving linear arrays of pulsed lasers, or for applications in printing technology, since in both environments considerable temperature fluctuations, to which the ceramic housing 1 is insensitive, may occur.

Moreover, the dimensional stability of the ceramic housing 1 is particularly advantageous. Particularly good dimensional stability of the ceramic housing and of the semiconductor chip 13 which is introduced into it results if the semiconductor chip 13 is produced on the basis of a III-V compound semiconductor, material based on $Al_2O_3$ is used for the ceramic and a glass which is matched to the coefficient of thermal expansion of the ceramic and a cover matched to the ceramic, for example made from Kovar, are selected.

Finally, the particularly leak-tight seal of the ceramic housing according to the invention should be emphasized, meaning that the ceramic housing 1 likewise appears suitable for applications in dirt-laden environments.

The invention claimed is:

1. A process for producing a housing for photoactive semiconductor chips, comprising the steps of:
   providing a trough-shaped ceramic base body defined by sidewalls and having a trough opening, into one side wall of which a side opening is formed from the trough opening;
   forming a securing surface, which surrounds the side opening, for a window by fitting a metal part, which separates the trough opening from the side opening, to the ceramic base body; and
   fitting the window to the securing surface.

2. The process as claimed in claim 1, in which first of all a base made from ceramic material is provided, and then side walls are fitted onto it.

3. The process as claimed in claim 2, in which the side walls are formed by U-shaped strips stacked on top of one another.

4. The process as claimed in claim 2, in which the ceramic base body is sintered before the metal part is applied.

5. The process as claimed in claim 1, in which the window is soldered to the ceramic base body and to the metal part.

6. The process as claimed in claim 5, in which a soldering glass is used for the soldering operation.

7. The process as claimed in claim 5, in which the window is coated with a metal layer and is soldered on with the aid of a metal solder.

8. The process as claimed in claim 1, in which the metal part used is a metal frame.

9. The process as claimed in claim 8, in which the photoactive semiconductor chip is introduced into the housing through the opening in the metal frame, and then the metal frame is closed by soldering on a metal cover.

10. The process as claimed in claim 1, in which the photoactive semiconductor chip is produced on the basis of a III-V compound semiconductor, and the ceramic is produced on the basis of $Al_2O_3$, glass with a coefficient of thermal expansion of between 6 and $8\times10^{-6}/°$ C. being used for the window.

11. The process as claimed in claim 1, in which the photoactive semiconductor chip is a semiconductor chip which emits electromagnetic radiation.

12. The process as claimed in claim 1, in which the photoactive semiconductor chip is a semiconductor chip which receives electromagnetic radiation.

13. A housing for a photoactive semiconductor chip, comprising:
   a trough-shaped ceramic base body defined by sidewalls and having a trough opening, and a side opening formed in one of said sidewalls;
   a metal part fitted to the ceramic base body and separating the side opening from the trough opening, the metal part together with the ceramic base body forming a securing surface surrounding the side opening; and
   a window fitted to the securing surface.

14. The housing as claimed in claim 13, in which the photoactive semiconductor chip is a semiconductor chip which emits electromagnetic radiation.

15. The housing as claimed in claim 14, in which the photoactive semiconductor chip is a semiconductor chip which receives electromagnetic radiation.

* * * * *